(12) United States Patent
Lim

(10) Patent No.: US 8,748,955 B2
(45) Date of Patent: Jun. 10, 2014

(54) CMOS IMAGE SENSOR AND METHOD FOR FABRICATING THE SAME

(75) Inventor: Youn-Sub Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/599,999

(22) Filed: Aug. 30, 2012

(65) Prior Publication Data

US 2014/0008709 A1 Jan. 9, 2014

(30) Foreign Application Priority Data

Jul. 6, 2012 (KR) .................. 10-2012-0073978

(51) Int. Cl.
*H01L 31/0224* (2006.01)

(52) U.S. Cl.
USPC .................................. 257/292; 257/E27.133

(58) Field of Classification Search
CPC ..................... H01L 27/1463; H01L 27/14689; H01L 27/14643; H01L 27/14601; H01L 27/14625; H01L 27/14687; H01L 27/14607; H01L 27/1461; H01L 25/167

USPC .................. 257/290–292, E27.133, E31.127, 257/E31.124; 438/73
See application file for complete search history.

(56) References Cited

U.S. PATENT DOCUMENTS

| 2008/0303072 A1* | 12/2008 | Lee et al. | 257/292 |
| 2009/0026510 A1* | 1/2009 | Lim | 257/292 |

FOREIGN PATENT DOCUMENTS

| KR | 10-2005-0040026 | 5/2005 |
| KR | 10-2010-0040017 | 4/2010 |
| KR | 10-0962470 | 6/2010 |

* cited by examiner

*Primary Examiner* — Whitney T Moore
(74) *Attorney, Agent, or Firm* — IP & T Group LLP

(57) ABSTRACT

A CMOS image sensor includes a substrate, a punch-through prevention layer formed over the substrate, an epitaxial layer formed over the punch-through prevention layer, a gate electrode formed over the epitaxial layer; a photodiode formed in the epitaxial layer to be substantially aligned with one side of the gate electrode, a floating diffusion region formed in the epitaxial layer to be substantially aligned with the other side of the gate electrode, and an extended photodiode region formed below the photodiode to be coupled with the punch-through prevention layer.

17 Claims, 9 Drawing Sheets

CMOS IMAGE SENSOR AND METHOD FOR FABRICATING THE SAME

CROSS-REFERENCE TO RELATED APPLICATIONS

The present application claims priority of Korean Patent Application No. 10-2012-0073978, filed on Jul. 6, 2012, which is incorporated herein by reference in its entirety.

BACKGROUND

1. Field

Exemplary embodiments of the present invention relate to a semiconductor device fabrication technology, and more particularly, to a complementary metal-oxide semiconductor (CMOS) image sensor and a method for fabricating the same.

2. Description of the Related Art

A complementary metal-oxide semiconductor (CMOS) image sensor is an integrated sensor having a block configured to amplify or process signal in a sensor chip using an active element such as a MOS or CMOS transistor.

In general, a unit pixel of the CMOS image sensor includes one photodiode PD and four NMOS transistors TX, RX, SX, and DX as explained below. The transfer transistor TX transfers photogenerated charges collected by the photodiode PD to a floating diffusion region FD. The reset transistor RX serves to set the potential of a node to a desired value and discharge charges Cpd the photogenerated charges to reset the floating diffusion region FD. The drive transistor DX serves as a source follower buffer amplifier. The select transistor SX performs addressing through a switching operation.

Here, the transfer transistor TX and the reset transistor RX include a native NMOS transistor, and the drive transistor DX and the select transistor SX include a normal NMOS transistor. The reset transistor RX is a transistor for correlated double sampling (CDS).

That is, in each image pixel of the CMOS image sensor, general CMOS elements are used to implement the photodiode and the transistors. Therefore, the existing CMOS process may be applied. Accordingly, an integrated image signal processing and detecting unit may be provided in a block outside the pixel.

FIG. 1 is a cross-sectional view of a conventional CMOS image sensor.

Referring to FIG. 1, a punch-through prevention layer 12 is formed over a substrate 11. An epitaxially-grown silicon epitaxial layer 13 is formed over the punch-through prevention layer 12. An isolation layer 15B is formed. The isolation layer 15B is included in a channel stop region 15A formed from a surface of the silicon epitaxial layer 13. A gate electrode 16 of a transfer transistor TX is formed over the silicon epitaxial layer 13. An N-type diffusion layer 17 is formed in the silicon epitaxial layer 13 to be aligned with one edge of the gate electrode 16. A P-type diffusion layer 18 is formed over the N-type diffusion layer 17 and below the surface of the silicon epitaxial layer 13 while aligned with the one edge of the gate electrode 15.

As a result, a photodiode that includes the N-type diffusion layer 17 and the P-type diffusion layer 18 is formed.

At this time, in order to suppress crosstalk and improve sensitivity, an extended photodiode region 19 is formed below the N-type diffusion layer 17 to overlap a part of the gate electrode 16.

Furthermore, in order to prevent crosstalk between adjacent pixels, a P-type field stop region 14 is formed below the channel stop region 15A in the silicon epitaxial layer 13 to be contacted with the punch-through prevention layer 12. At this time, one side of the P-type field stop region 14 is aligned with a center of the gate electrode 16, and contacted with one side of the extended photodiode region 19.

Furthermore, a floating diffusion region 20 is formed in the P-type field stop region 14 to be substantially aligned with the other side of the gate electrode 16.

However, when the extended photodiode region 19 is formed to suppress crosstalk and improve sensitivity, there are difficulties in forming the extended photodiode region 19 by ion-implanting high concentration N-type impurities. The reason is that a specific dose of photogenerated charges are not normally transferred to the floating diffusion region 20 through a channel of the gate electrode 16 under a limited voltage condition of the gate electrode, thereby causing an image lag. Because a space where a depletion region is to be extended is insufficient, an image lag may occur, and sensing characteristics may be degraded.

SUMMARY

Exemplary embodiments of the present invention are directed to a CMOS image sensor that includes an extended photodiode region to suppress an image lag and crosstalk and improve photosensitivity, and a method for fabricating the same.

In accordance with an exemplary embodiment of the present invention, a CMOS image sensor includes a substrate, a punch-through prevention layer formed over the substrate, an epitaxial layer formed over the punch-through prevention layer, a gate electrode of a transfer transistor formed over the epitaxial layer, a photodiode formed in the epitaxial layer to be substantially aligned with one side of the gate electrode, a floating diffusion region formed in the epitaxial layer to be substantially aligned with the other side of the gate electrode, and an extended photodiode region formed below the photodiode to be coupled with the punch-through prevention layer.

In accordance with another exemplary embodiment of the present invention, a method for fabricating a CMOS image sensor includes forming a substrate, forming a punch-through prevention layer over the substrate, forming an epitaxial layer over the punch-through prevention layer, forming an extended photodiode region in the epitaxial layer to be coupled with the punch-through prevention layer, forming a first doped region in a part of the surface of the extended photodiode region, forming a gate electrode over the epitaxial layer so that the gate electrode overlaps the first doped region, forming a photodiode over the extended photodiode region so that the photodiode is substantially aligned with one side of the gate electrode, and forming a floating diffusion region over the first doped region so that the floating diffusion region is substantially aligned with the other side of the gate electrode.

DETAILED DESCRIPTION

Figure 1:
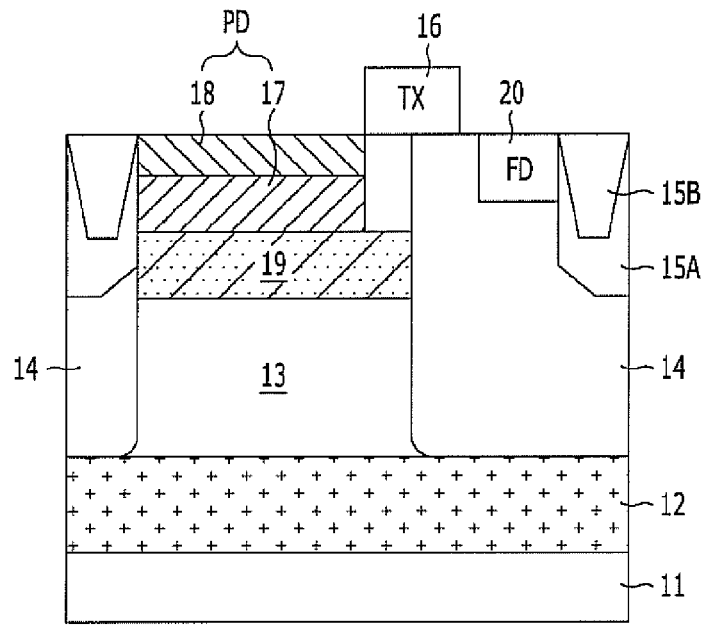
FIG. 1 is a cross-sectional view of a conventional CMOS image sensor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
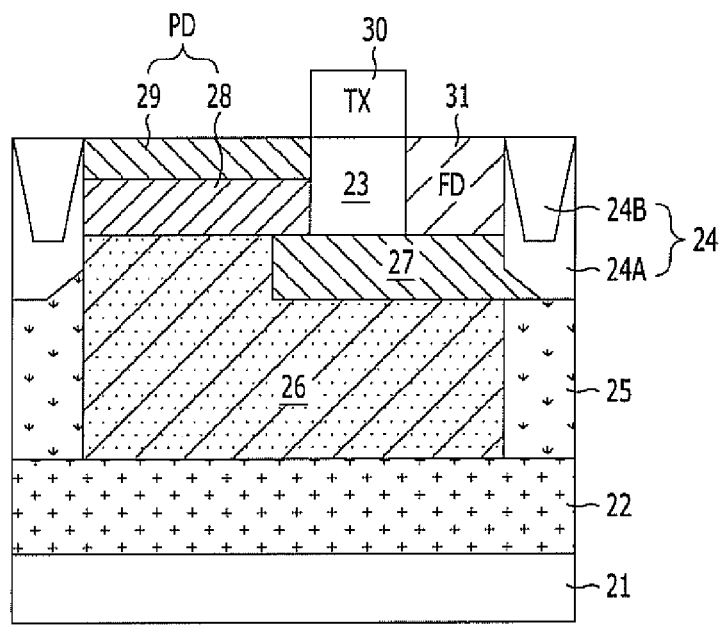
FIG. 2 is a cross-sectional view of a CMOS image sensor in accordance with an embodiment of the present invention.

FIG. 2 is a cross-sectional view of a CMOS image sensor in accordance with an embodiment of the present invention.

Referring to FIG. 2, a punch-through prevention layer 22 is formed by doping a substrate 21 with high-concentration P-type impurities. A silicon epitaxial layer 23 which is epitaxially-grown is formed over the substrate, and an isolation layer 24B is formed in a channel stop region 24A. The channel stop region 24A is formed from the surface of the silicon epitaxial layer 23 to be separated from the top of the punch-through prevention layer 22. Here, the channel stop region 24A isolates elements. As a result, an isolation structure 24 is formed by a stacked layer structure that includes the channel stop region 24A and the isolation layer 24B.

Furthermore, a gate electrode 30 of a transfer transistor TX is formed over the silicon epitaxial layer 23.

An N-type diffusion layer 28 is formed in the silicon epitaxial layer 23 to be substantially aligned with one side of the isolation structure 24 while substantially aligned with one side of the gate electrode 30. A P-type diffusion layer 29 is formed over the N-type diffusion layer 28 and below the surface of the silicon epitaxial layer 23 to be substantially aligned with the one side of the gate electrode 30.

As a result, a photodiode PD that includes the N-type diffusion layer 28 and the P-type diffusion layer 29 is formed.

Furthermore, a floating diffusion region 31 doped with N-type impurities is formed to be substantially aligned with the other side of the gate electrode 30, while the photodiode PD is substantially aligned with the one side of the gate electrode 30.

In addition, the structure in accordance with the embodiment of the present invention includes an extended photodiode region 26, which is formed below the N-type diffusion layer 28. The extended photodiode region 26 secures a photodiode capacity as much as possible.

In order to prevent crosstalk, a well region 25 doped with P-type impurities is formed below the channel stop region 24A to surround the sidewalls of the extended photodiode region 26 while in contact with the punch-through prevention layer 22.

At this time, the well region 25 may be formed by ion-implanting P-type impurities, for example, boron (B) at proper energy and dose conditions. For example, the P-type impurities may be ion-implanted at approximately $1\times10^{12}$ to $2\times10^{12}$ dose/cm$^2$ through two or three energy steps.

Furthermore, a first doped region 27 is formed over the extended photodiode region 26 and below the floating diffusion region 31 and the gate electrode 30. The first doped region 27 may be doped with P-type impurities.

The first doped region 27 is formed at a depth of approximately 0.5 μm to 0.8 μm from the surface of the silicon epitaxial layer 23. The first doped region 27 maximizes the electrical connection between the P-type diffusion layer 29, the channel stop region 24A, the well region 25, and the punch-through prevention layer 22. Also, the first doped region 27 simultaneously promotes a transmission of photo-generated charges from the extended photodiode region 26 to the floating diffusion region 31, thereby suppressing the degradation of image lag characteristics.

FIGS. 3A to 3H and FIGS. 4A to 4H are cross-sectional views and plan views illustrating a method for fabricating a CMOS image sensor in accordance with an embodiment of the present invention. FIGS. 3A to 3H are cross-sectional views taken along lines A-A' of FIGS. 4A to 4H.

Figure 3A:
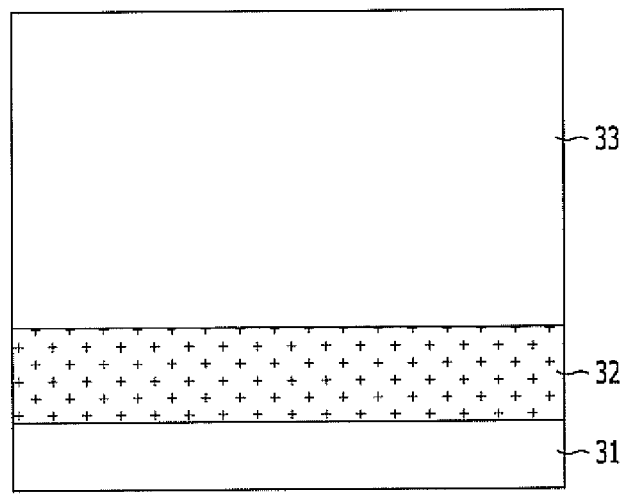
FIGS. 3A to 3H are cross-sectional views illustrating a method for fabricating a CMOS image sensor in accordance with an embodiment of the present invention.
Figure 4A:
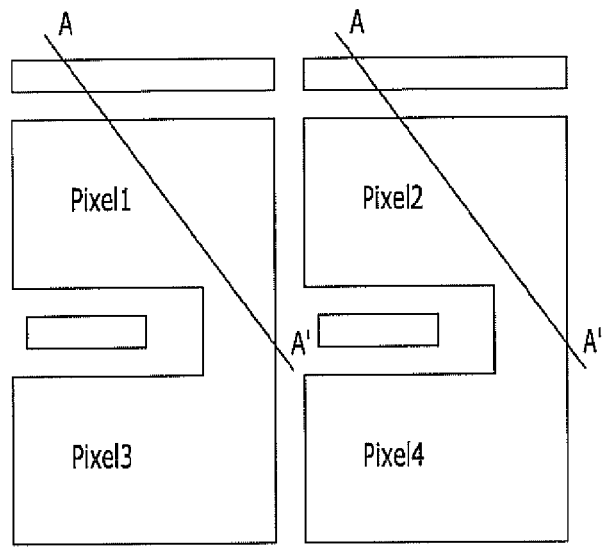
FIGS. 4A to 4H are plan views illustrating a method for fabricating a CMOS image sensor in accordance with an embodiment of the present invention.

Referring to FIGS. 3A and 4A, a punch-through prevention layer 32 is formed over a substrate 31. The punch-through prevention layer 32 may include an impurity layer formed by doping the substrate with high-concentration P-type impurities.

The impurities for forming the punch-through prevention layer 32 may include P-type impurities, for example, boron (B). The doping concentration of the impurities may be at least $1\times10^{18}$ atoms/cm$^2$ to guarantee desirable characteristics of the punch-through prevention layer 32.

A silicon epitaxial layer 33 is formed over the substrate 31 and the punch-through prevention layer 32. The silicon epitaxial layer 33, where components of the CMOS image sensor, such as a photodiode, are formed, is formed to have a single-crystal state. The silicon epitaxial layer 33 having a single-crystal state may be formed by an epitaxial growth method.

The silicon epitaxial layer 33 may include a silicon epitaxial layer doped with impurities. For example, the impurities may have the same conductive type (P-type) as the punch-through prevention layer 32, and the silicon epitaxial layer 33 may have a lower doping concentration than the punch-through prevention layer 32.

Figure 3B:
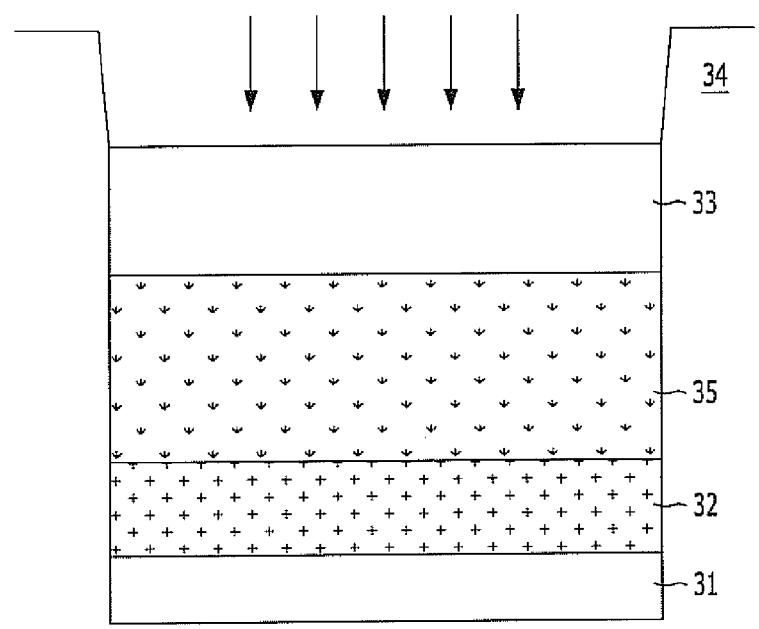
Figure 4B:
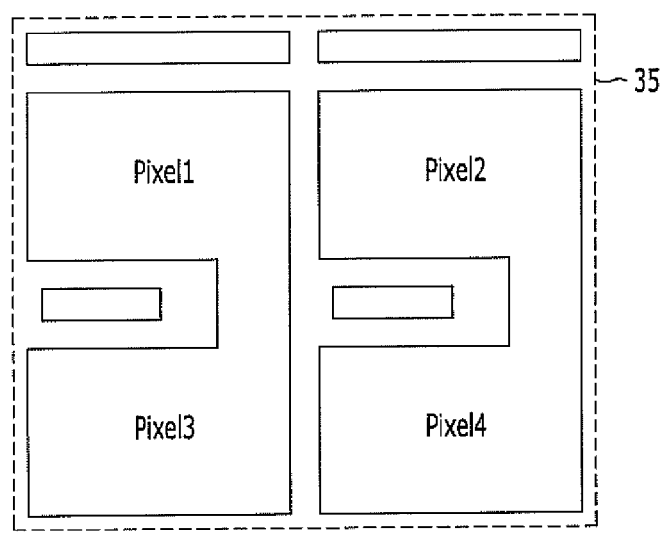

Referring to FIGS. 3B and 4B, P-type impurities are ion-implanted into the silicon epitaxial layer 33 to form a well region 35 that contacts the punch-through prevention layer 32.

The well region 35 is formed by the following process. First, photoresist is applied onto the silicon epitaxial layer 33 and selectively patterned to form a first mask pattern 34 for ion-implanting P-type impurities.

At this time, both sides of the first mask pattern 34 are substantially aligned with both sides of the silicon epitaxial layer 33, thereby exposing the surface of the silicon epitaxial layer 33, where the well region 35 is to be formed.

The well region 35 is formed by ion-implanting low-concentration P-type impurities, for example, boron (B) into the silicon epitaxial layer 33 at approximately $1\times10^{12}$ to $2\times10^{12}$ dose/cm$^2$ through two or three energy steps.

Figure 3C:
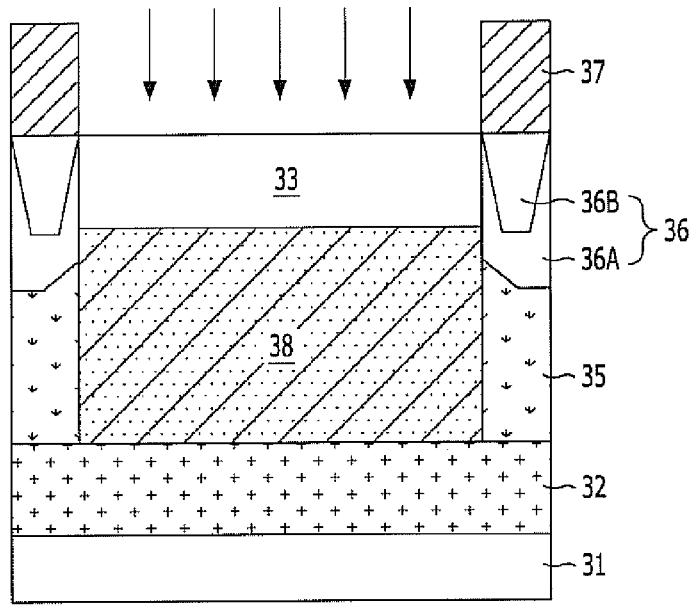

Here, the well region 35 secures an extended photodiode region 38 of FIG. 3C as much as possible, and thereby the saturation (Qsat) of the photodiode PD may be secured, and desirable photosensitivity characteristics may be acquired. Furthermore, it is possible to suppress crosstalk between adjacent pixels, which occurs when electrons generated by incident light on the photodiode PD are recombined or electrons are not collected into a depletion region of the photodiode but transferred to the adjacent pixels, thereby causing distortion.

Figure 4C:
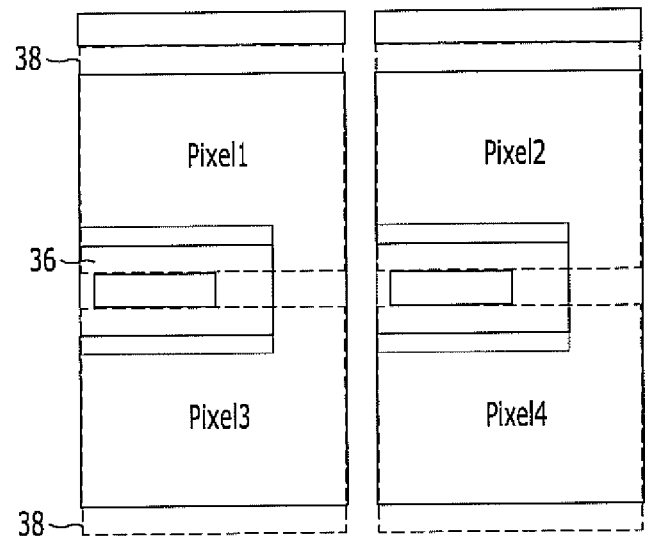

Referring to FIGS. 3C and 4C, an isolation structure 36 that includes a stack structure of a channel stop region 36A and an isolation layer 36B is formed to isolate unit pixels adjacent to the silicon epitaxial layer 33.

Although not illustrated, a channel stop mask for forming the channel stop region 36A in the silicon epitaxial layer 33 is formed over the silicon epitaxial layer 33. Using the channel stop mask as an ion implantation mask, P-type impurities are ion-implanted into the silicon epitaxial layer 33 to form the channel stop region 36A.

In order to form the isolation layer 36B, an isolation mask is formed over the silicon epitaxial layer 33. The mask process for forming the isolation mask may include a shallow trench isolation (STI) process.

For example, pad oxide and pad nitride are sequentially deposited on the silicon epitaxial layer 33, and photoresist is applied onto the pad nitride. Then, a patterning process including exposure and development is performed to form the isolation mask for forming a trench.

The pad oxide and the pad nitride, exposed by the isolation mask, are simultaneously etched to partially expose the surface of the silicon epitaxial layer 33. Then, the exposed silicon epitaxial layer 33 is etched to a predetermined depth toward the well region 35, thereby forming a trench.

After the isolation mask is removed, oxide may be deposited on the entire surface of the resulting structure that includes the trench by chemical vapor deposition (CVD) exhibiting a desirable gap-fill characteristic, and may be planarized by chemical mechanical polishing (CMP) until the pad nitride and the pad oxide are removed. The planarized oxide may be isotropically etched by wet etching to form the isolation layer 36B buried in the trench.

In order to expand the capacity of the photodiode PD, an extended photodiode region 38 is formed in the well region 35 to be in contact with the punch-through prevention layer 32. The extended photodiode region 38 is formed to secure the capacity of the photodiode as much as possible.

The extended photodiode region 38 is formed by the following processes. First, photoresist is applied onto the silicon epitaxial layer 33 and selectively patterned to form a second mask pattern 37 for ion-implanting N-type impurities. Then, N-type impurities are ion-implanted into the silicon epitaxial layer 33 exposed by the second mask pattern 37, or specifically, the well region 35, thereby forming the extended photodiode region 38 in the well region 35.

The extended photodiode region 38 is formed by ion-implanting N-type impurities, for example, phosphorous (P) or similar N-type impurities into the well region 35 at proper energy and dose conditions, in consideration of the dose condition of the P-type impurities of the well region 35. For example, the N-type impurities may be ion-implanted at approximately $2 \times 10^{12}$ to $4 \times 10^{12}$ dose/cm$^2$ through two or three energy steps.

Figure 3D:
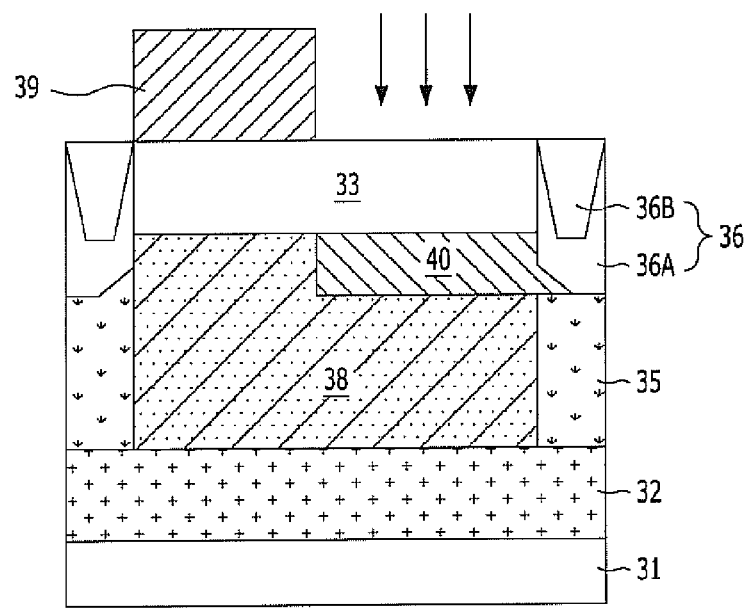
Figure 4D:
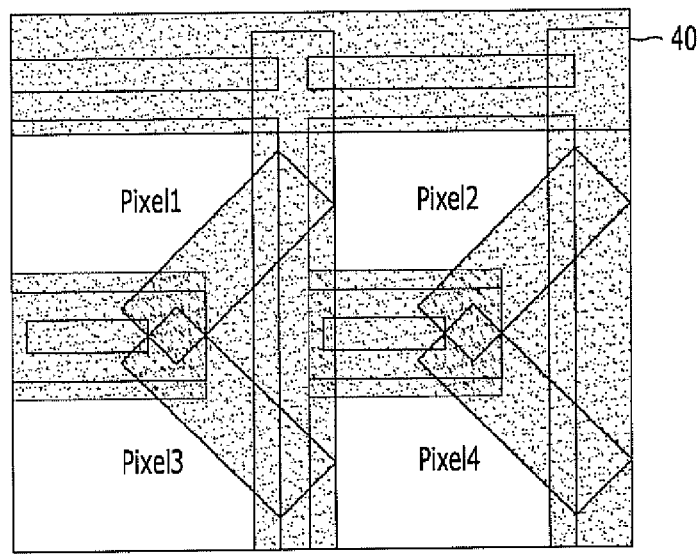

Referring to FIGS. 3D and 4D, a first doped region 40 is formed by ion-implanting P-type impurities into a part of the extended photodiode region 38 by using a third mask pattern 39 as an ion implantation mask.

The first doped region 40 is formed to extend to a part of a photodiode, which will be subsequently formed, while overlapping a gate electrode and a floating diffusion region, which will be subsequently formed as well. Specifically, the first doped region 40 may be formed by ion-implanting P-type impurities into a part of the extended photodiode region 38, which may correspond to a thickness range of 0.5 µm to 0.8 µm from the surface of the silicon epitaxial layer 33. Furthermore, the first doped region 40 maximizes the electrical connection between a subsequent P-type diffusion layer, the channel stop region 36A, the well region 35, and the punch-through prevention layer 32. Also, the first doped region 40 simultaneously promotes a transmission of photo-generated charges from the extended photodiode region 38 to the floating diffusion region, which will be subsequently formed, thereby suppressing the degradation of image lag characteristics.

Figure 3E:
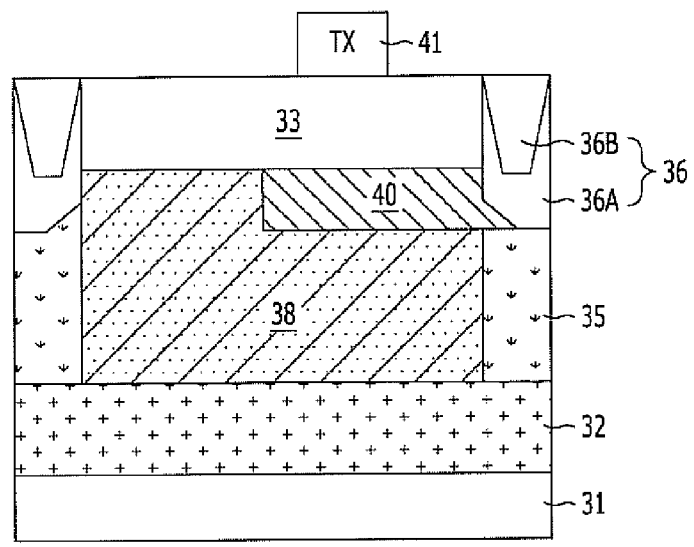
Figure 4E:
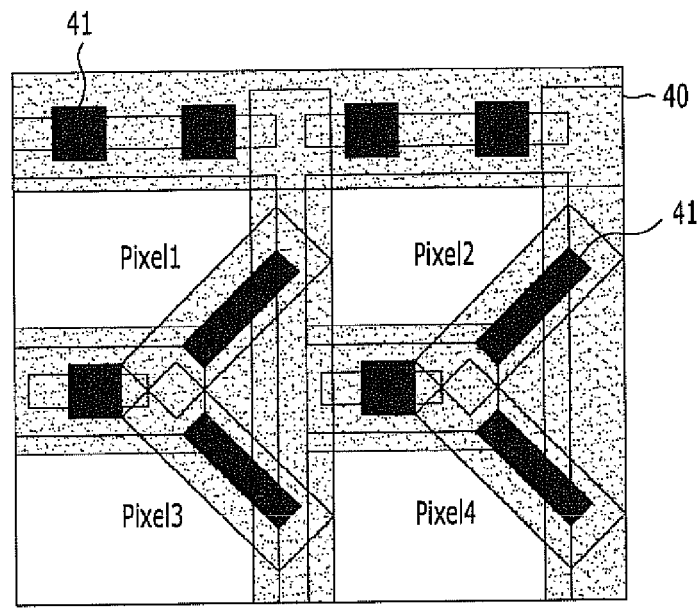

Referring to FIGS. 3E and 4E, a gate electrode 41 is formed over the silicon epitaxial layer 33.

That is, the gate electrode 41 is formed over the silicon epitaxial layer 33, which overlaps one side of the first doped region 40.

Figure 3F:
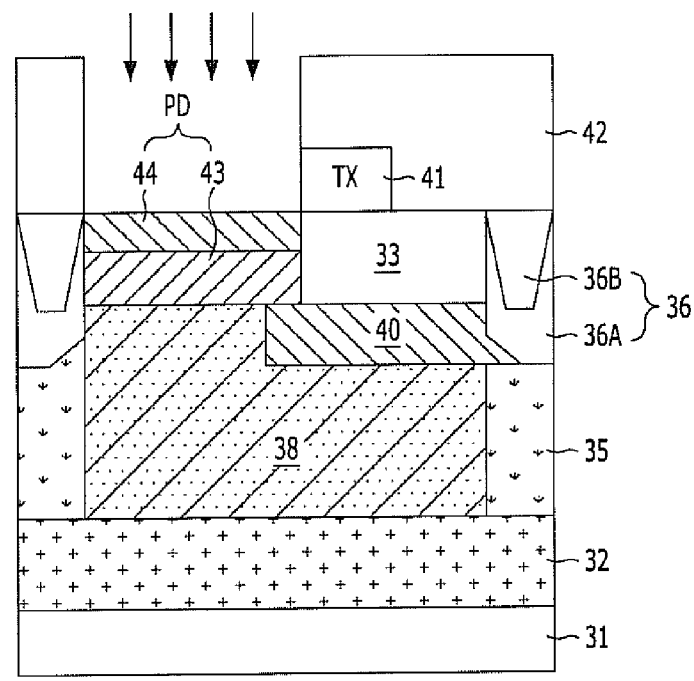
Figure 4F:
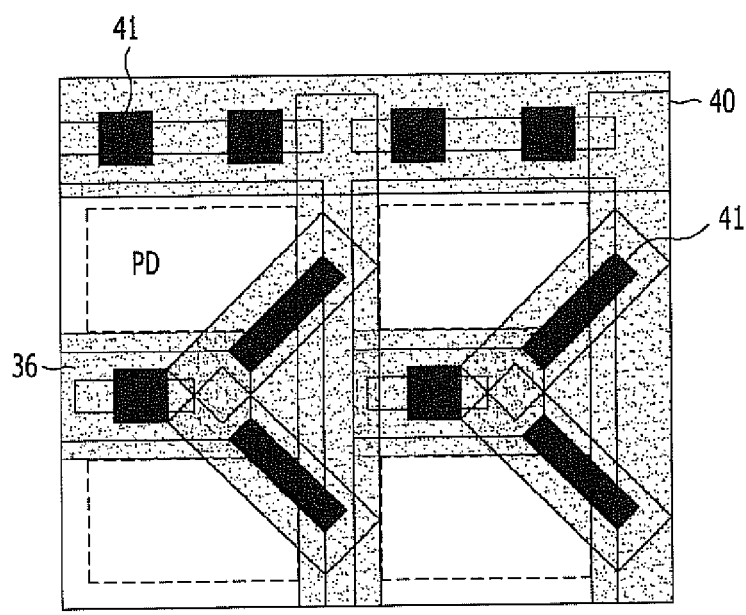

Referring to FIGS. 3F and 4F, photoresist is applied onto the entire surface of the resulting structure including the gate electrode 41 and then selectively patterned to form a fourth mask pattern 42 for ion-implanting low concentration N-type impurities at a high energy condition.

At this time, one side of the fourth mask pattern 42 is substantially aligned with one side of the gate electrode 41, and the other side of the fourth mask pattern 42 is substantially aligned with one side of the channel stop region 36A, thereby exposing the surface of the silicon epitaxial layer 33 where a photodiode is formed.

Using the fourth mask pattern 42 as an ion-implantation mask, N-type impurities are ion-implanted to form an N-type diffusion layer 43 to the surface of the extended photodiode region 38. One side of the N-type diffusion layer 43 is substantially aligned with one side of the gate electrode 41, and the other side of the N-type diffusion layer 43 is in contact with one side surface of the channel stop region 36A.

The fourth mask pattern 42 may be reused to form a P-type diffusion layer 44 in the silicon epitaxial layer 33 exposed by the fourth mask pattern 42, or more specifically, over the N-type diffusion layer 43 and below the surface of the silicon epitaxial layer 33 so that the P-type diffusion layer 44 is substantially aligned with one side of the gate electrode 41.

Through the ion-implantation of the P-type impurities, a PN junction that includes the P-type diffusion layer 44 and the N-type diffusion layer 43 is formed, and an extended photodiode that includes the extended photodiode region 38, the N-type diffusion layer 43, and the P-type diffusion layer 44 is formed.

Figure 3G:
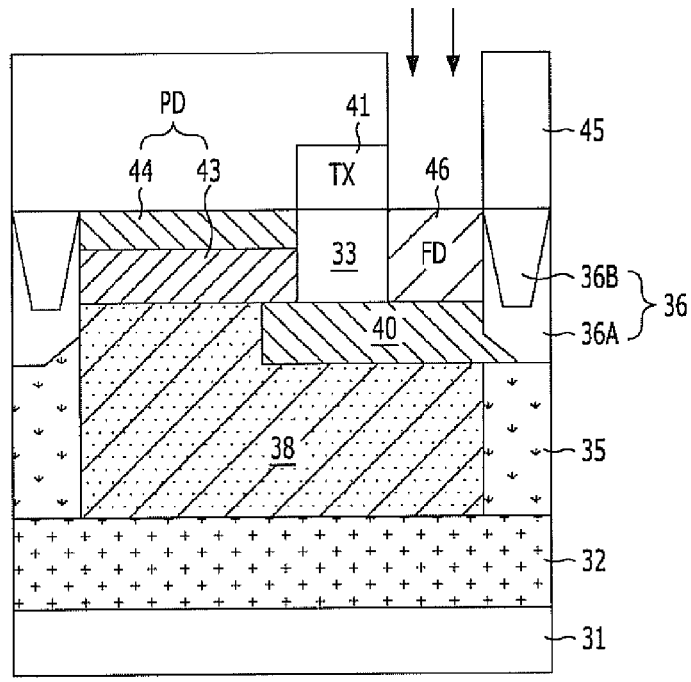
Figure 4G:
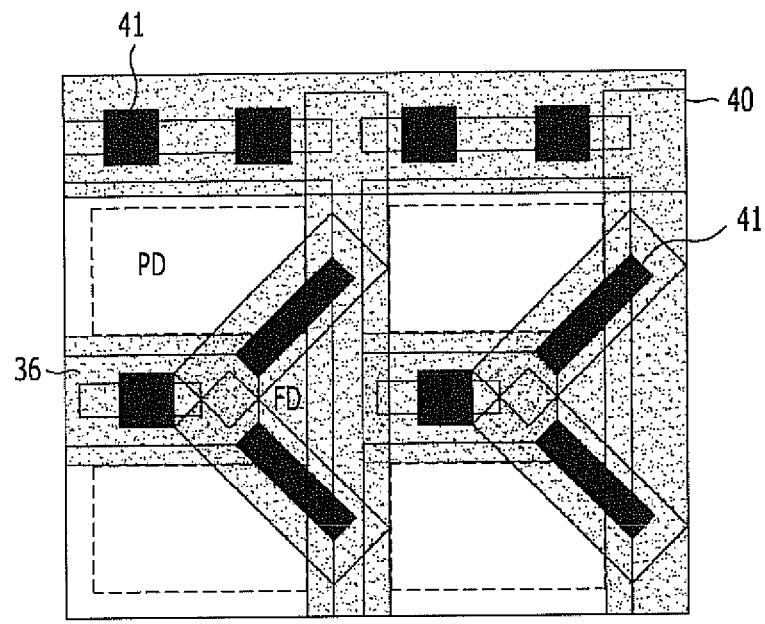

Referring to FIGS. 3G and 4G, the fourth mask pattern 42 is removed, and photoresist is applied onto the entire surface of the resulting structure and then patterned through exposure and development to form a fifth mask pattern 45 exposing the silicon epitaxial layer 33 at the other side of the gate electrode 41.

Figure 3H:
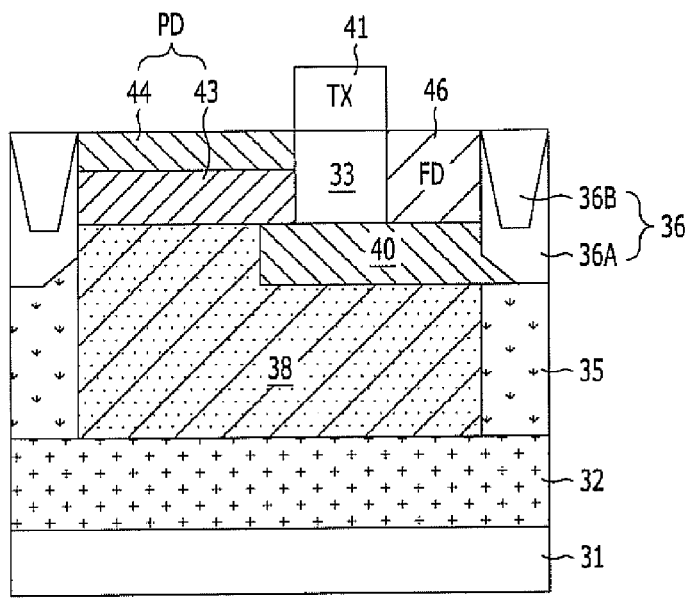
Figure 4H:
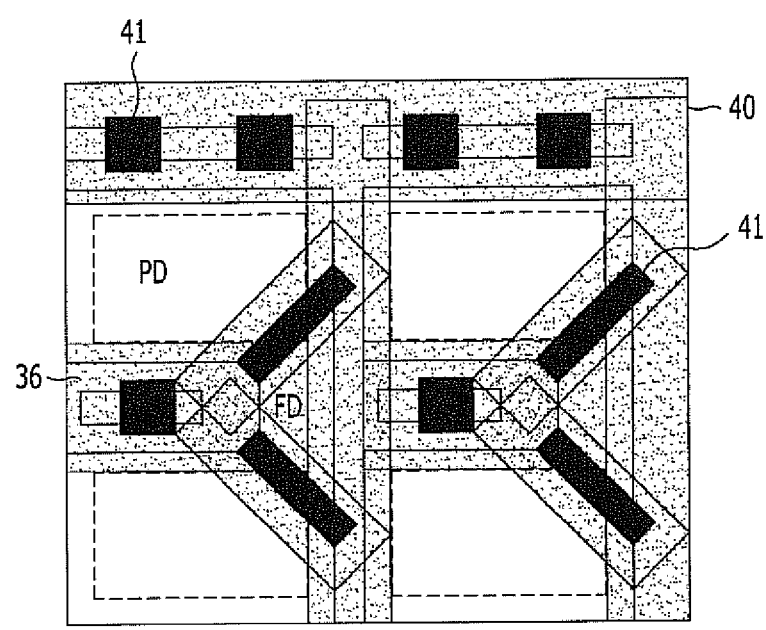

Using the fifth mask pattern 45 as an ion-implantation mask, N-type impurities are implanted to form a floating diffusion region 46. Furthermore, the fifth mask pattern 45 is removed to complete a CMOS image sensor as illustrated in FIGS. 3H and 4H.

In accordance with the embodiments of the present invention, the extended photodiode region is formed to be extended to the bottom of the floating diffusion region (substantially aligned with one side of the floating diffusion region) and to be in contact with the punch-through prevention layer. Therefore, the capacitor area of the photodiode may be easily secured to improve photosensitivity. Furthermore, as the first doped region is formed between the bottom of the floating diffusion region and the extended photodiode region, the photogenerated transmission efficiency may be increased to suppress an image lag.

Furthermore, since both sidewalls of the extended photodiode region are surrounded by the first conductive-type well region, it is possible to suppress crosstalk, which is caused by entering of photogenerated charges into adjacent pixels.

While the present invention has been described with respect to the specific embodiments, it will be apparent to those skilled in the art that various changes and modifications may be made without departing from the spirit and scope of the invention as defined in the following claims.

What is claimed is:

1. A CMOS image sensor comprising:
    a substrate;
    a punch-through prevention layer formed over the substrate;
    an epitaxial layer formed over the punch-through prevention layer;
    a gate electrode of a transfer transistor formed over the epitaxial layer;
    a photodiode formed in the epitaxial layer to be substantially aligned with one side of the gate electrode;
    a floating diffusion region formed in the epitaxial layer to be substantially aligned with the other side of the gate electrode; and
    an extended photodiode region formed below the photodiode to be coupled with the punch-through prevention layer, wherein one side of the extended photodiode region overlaps the photodiode, and the other side of the extended photodiode region overlaps the floating diffusion region.

2. The CMOS image sensor of claim 1, further comprising:
    a well region of a first conductive-type configured to surround both side surfaces of the extended photodiode region.

3. The CMOS image sensor of claim 1, wherein the photodiode comprises:
    an N-type diffusion layer formed in the epitaxial layer to be substantially aligned with the one side of the gate electrode; and
    a P-type diffusion layer formed over the N-type diffusion layer,
    wherein the extended photodiode region is coupled with the N-type diffusion layer.

4. The CMOS image sensor of claim 3, wherein the extended photodiode region is doped with N-type impurities.

5. The CMOS image sensor of claim 2, further comprising:
    a first doped region formed below the gate electrode and the floating diffusion region.

6. The CMOS image sensor of claim 5, wherein the extended photodiode region has an impurity concentration lower than the well region.

7. The CMOS image sensor of claim 5, wherein one side of the first doped region overlaps a part of the photodiode, and the other side of the first doped region overlaps the floating diffusion region.

8. A method for fabricating a CMOS image sensor, comprising:
    forming a substrate;
    forming a punch-through prevention layer over the substrate;
    forming an epitaxial layer over the punch-through prevention layer:
    forming an extended photodiode region in the epitaxial layer to be coupled with the punch-through prevention layer;
    forming a first doped region in a part of the surface of the extended photodiode region;
    forming a gate electrode over the epitaxial layer such that the gate electrode overlaps the first doped region;
    forming a photodiode over the extended photodiode region such that the photodiode is substantially aligned with one side of the gate electrode; and
    forming a floating diffusion region over the first doped region so that the floating diffusion region is substantially aligned with the other side of the gate electrode.

9. The method of claim 8, further comprising:
    forming a well region of the first conductive-type in the epitaxial layer to be coupled with the punch-through prevention layer before the forming of the extended photodiode region; and
    forming an isolation structure having a stacked layer of a channel stop region and an isolation layer in the epitaxial layer.

10. The method of claim 9, wherein the well region is formed to surround both sides of the extended photodiode region.

11. The method of claim 9, wherein the extended photodiode region is formed to have an impurity concentration lower than the well region.

12. The method of claim 9, wherein the channel stop region is formed by ion-implanting P-type impurities.

13. The method of claim 9, wherein the forming of the photodiode comprises:
    forming an N-type diffusion layer in the epitaxial layer to be substantially aligned with the one side of the gate electrode; and
    forming a P-type diffusion layer over the N-type diffusion layer,
    wherein the extended photodiode region is coupled with the N-type diffusion layer.

14. The method of claim 13, wherein the extended photodiode region is formed by implanting N-type impurities.

15. The method of claim 13, wherein the first doped region, the P-type diffusion layer, the channel stop region, the well region, and the punch-through prevention layer are connected to each other.

16. The method of claim 8, wherein one side of the extended photodiode region overlaps the photodiode, and the other side of the extended photodiode region overlaps the floating diffusion region 17. The method of claim 8, wherein the first doped region is formed to extend to a part of the photodiode while overlapping the gate electrode and the floating diffusion region.

* * * * *